United States Patent [19]

Carlstedt

[11] Patent Number: 5,406,025

[45] Date of Patent: Apr. 11, 1995

[54] VLSI-CHIPS PACKAGE WITH FLOATINGLY MOUNTED CHIP MEANS

[75] Inventor: L. Gunnar Carlstedt, Partille, Sweden

[73] Assignee: Carlstedt Elektronik AB, Gotenburg, Sweden

[21] Appl. No.: 844,989

[22] Filed: Feb. 28, 1992

[30] Foreign Application Priority Data

Mar. 1, 1991 [SE] Sweden ............................. 9100597

[51] Int. Cl.⁶ .......................................... H05K 5/06
[52] U.S. Cl. .......................... 174/17.08; 174/52.2; 29/832
[58] Field of Search ................. 174/16.3, 17.08, 17.05, 174/52.2, 18; 29/827, 832, 840, 841; 257/706, 712, 713, 718, 719, 777, 778; 361/336, 387, 388, 414, 704, 705; 439/68-73; 206/330

[56] References Cited

U.S. PATENT DOCUMENTS

| | | | |
|---|---|---|---|
| 4,546,411 | 10/1985 | Kaufman | 361/705 |
| 4,710,798 | 12/1987 | Marcantonio | 257/777 |
| 4,758,927 | 7/1988 | Berg | 29/827 X |
| 4,835,847 | 6/1989 | Kamperman | 29/840 |
| 4,855,868 | 8/1989 | Harding | 174/52.2 X |
| 4,941,255 | 7/1990 | Bull | 29/840 X |
| 4,974,317 | 12/1991 | Rodriguez, II et al. | 29/841 |

FOREIGN PATENT DOCUMENTS 1765810 2/1971 Germany ............................. 29/841

OTHER PUBLICATIONS

"Thin Film Module" IBM Technical Disclosure Bulletin, vol. 31, No. 8, Jan. 1989, pp. 135-138.

*Primary Examiner*—Peter Dungba Vo
*Attorney, Agent, or Firm*—Young & Thompson

[57] ABSTRACT

The invention relates to a package for VLSI-chips. A substrate means (A1;B1;C1), a frame means (3;14) and a lid means (A5;B5;C5) makes a housing having an inside cavity. First connection means (4;16) are provided on the inside of said cavity in electrical contact with external contact means (6;22) on the outside of the housing. A chip (A3;B3;C3) having second connection means (8;B19) is placed inside the cavity. At least one interconnection film (A2;B2;C2) is placed adjacent the chip (A3;B3;C3) and has third and fourth connection means (9,5;21,20). The third connection means (9;21) are positioned to make contact with the second connection means (8;B19) on the chip. The fourth connection means (5;20) are positioned to make contact with the first connection means (4;16) inside the cavity. Individual ohmic contacts are provided individually between chosen among the third and fourth connection means (9, 5;21,20) for making connection between chosen of the first and second connection means (4,8;16,22).

48 Claims, 10 Drawing Sheets

VLSI-CHIPS PACKAGE WITH FLOATINGLY MOUNTED CHIP MEANS

BACKGROUND OF THE INVENTION

Packages for electronic components includes a number of electrical circuit components such as transistors, diodes, capacitors, inductors and resistors. In many cases several components are collected on one integrated circuit.

Integrated circuit chips need encapsulation for a variety of reasons. The integrated circuits require mechanical support, protection against the environment, a supply of power, signal terminals and the removal of heat.

Hence the major functions of the package are circuit support and protection, atmosphere control, power distribution, signal distribution and heat conduction.

As a rule more than one packaging level is required to satisfy these conditions. The chip package constitutes the first level of packaging. At least one more level is usually employed because the number of functions needed may exceed those available on a single first level package.

The emergence of Very Large Scale Integration (VLSI) chips simplified circuit design but also increased the complexity of the majority of package designs. Many electric functions could be achieved on a few VLSI chips, which were mounted in packages. The chip packages were mounted on a board. If needed, some discrete components were mounted on such a board together with the VLSI chip packages. Boards, however, often became very complex because a high number of chip terminals were concentrated on a small area.

An alternative to boards emerged when higher wiring densities were achieved with hybrid technology and ceramic packages such as chip carriers, flat packs, pin-grid arrays and more complex packages which were capable of supporting from one chip to more than a hundred chips per package. It was possible to put several VLSI chips and discrete components on the same substrate, and connect them with each other via multilayer conductors on the substrate. It was still, however, necessary to interconnect many VLSI-chips with moderate dimensions and a limited number of pads within one or a few hybrid circuits in order to achieve high performance signal processing.

Connections between chip and package are commonly performed by wire bonding, soldering, or Tape Automated Bonding. Wire bonding is the most common chip-bonding technology, but it has limitations. One of the constraints is that thermal dissipation is limited mainly to the back of the chip.

In the latest edition of "Microelectronics Packaging Handbook" by Rao R. Tummala and Eugene J. Rymaszewski, 1989, the maximum number of connections per chip expected to be feasible with TAB technology is rated at 600 connections/chip. Regarding wire bonding the prediction was about 260 connections/chip. Manufacturing technology in 1988 allowed for 257 connections/chip by wire bond and 320 connections/chip by TAB.

As will be shown later in this specification a package is disclosed which exceeds the above expectations.

Packaging today can be divided into two main types, the ceramic package and the plastic package. Ceramic packages generally have better performance, while plastic packages usually have the advantage of being cheaper.

PROBLEMS IN PRIOR ART

Among the problems with todays packaging are unwanted inductances in the lines interconnecting different chips. Any additional or unnecessary length of a signal line introduces an increased inductance in that line, as well as delays in signal propagation.

A further problem, which is particularly apparent in high frequency applications, is that the interconnections may function as antennae or become capacitively or inductively coupled and thus interfere with signals on other signal lines. In circuits which are wire bonded care is therefore often taken to minimize the length of the bond wire.

Different thermal expansion in the different materials in the package can cause cracking of the chip or other component of the package, due to expansion mismatch.

Heat removal and chip cooling is often impaired by low pressure gas or other material with poor thermal conduction filling the space between the chip and the lid, with poor thermal conducting properties as a result.

The production costs for providing electric contact between chip and package is high due to the extensive work required for wire bonding each and every pad.

Ceramic substrates have been identified as one of the sources of ionic radiation (alpha particles), thereby presenting the problem of protecting the electric circuits from that radiation. This is sometimes dealt with by providing an organic coating on the devices enclosed in ceramic packages.

One problem with large packages is the problem of keeping them from cracking or leaking in junctions.

OBJECTS OF THE INVENTION

The object of the invention is to provide a package for integrated circuits which provides connections between the integrated circuits and external connectors on the outside of the package, while eliminating problems with thermal expansion mismatches between materials in the package.

Another important object of the invention is to provide a package for integrated circuits which provides improved thermal conduction from chip to ambient, by providing thermal paths in two principal directions from an active surface of a chip.

Another object of the invention is to provide a package for integrated circuits which provides a solution to thermal stress problems, which usually arises in packages due to different thermal expansion in the components of the package.

Still another object of the invention is to provide interconnect means for electrically connecting pads on a chip to pads on a substrate comprised in a package, and at the same time provide good thermal conduction from the chip and through said interconnect means to ambient.

Still another object of the invention is to provide a package for very large, or wafer-sized, chips with more than 750 signal and power terminals.

SUMMARY OF THE INVENTION

The main object of the invention is achieved by providing a package in accordance with claim 1.

The second object of the invention is achieved by providing thermal paths in two principal directions from an active surface of a chip.

Further objects and developments of the invention are achieved by features described in the other claims.

DEFINITIONS

Below follows a list on expressions used in this specification and their reserved meanings:

| | |
|---|---|
| bump | raised metal bumps ensuring electrical contact between pads on an interconnetion film and pads on the chip by focusing pressure to pads and thereby increasing contact pressure, and/or ensuring mechanical separation between the interconnetion film and the non-pad areas of the chip being bonded. A bump has a smaller contact area than the contact element to which it is intended to make electric contact. |
| chip carrier | a type of package for housing a semiconductor device. It has electrical terminals around its perimeter, or solder pads on its underside, rather than extended lead frame or plug-in pins. |
| interconnection film | an interconnection film comprises multilayer conductors and contact areas for contacting e.g. pads on a chip contact film and providing contact with pads that are connected to the outside of the package |
| Chip contact film | a chip contact film is a film with multilayer conductors provided on a chip for contacting pads on the chip, providing interconnections between circuits on the chip and providing pads for contacting the interconnection film. |
| OLB | short for Outer Lead Bonding. |
| pin-grid array | PGA, a package or interconnect scheme featuring a multiplicity of plug-in type electrical terminals arranged in a prescribed matrix format or array. |
| TAB | tape-automated-bonding is the process where silicon chips are joined to patterned metal on polymer tape, such as copper on polyimide, using thermo-compression bonding, and subsequently placed on a substrate or board by outer lead bonding. |
| tier | Substrate area providing space for pads. The purpose of these pads is connecting the substrate conductors to the interconnect or bond wires. |

BRIEF DESCRIPTION OF THE DRAWINGS

For a more complete understanding of the present invention and for further objects and advantages thereof, reference is now made to the following description taken in conjunction with the accompanying drawings, in which.

DESCRIPTION OF EMBODIMENTS OF THE INVENTION

Figure 1:
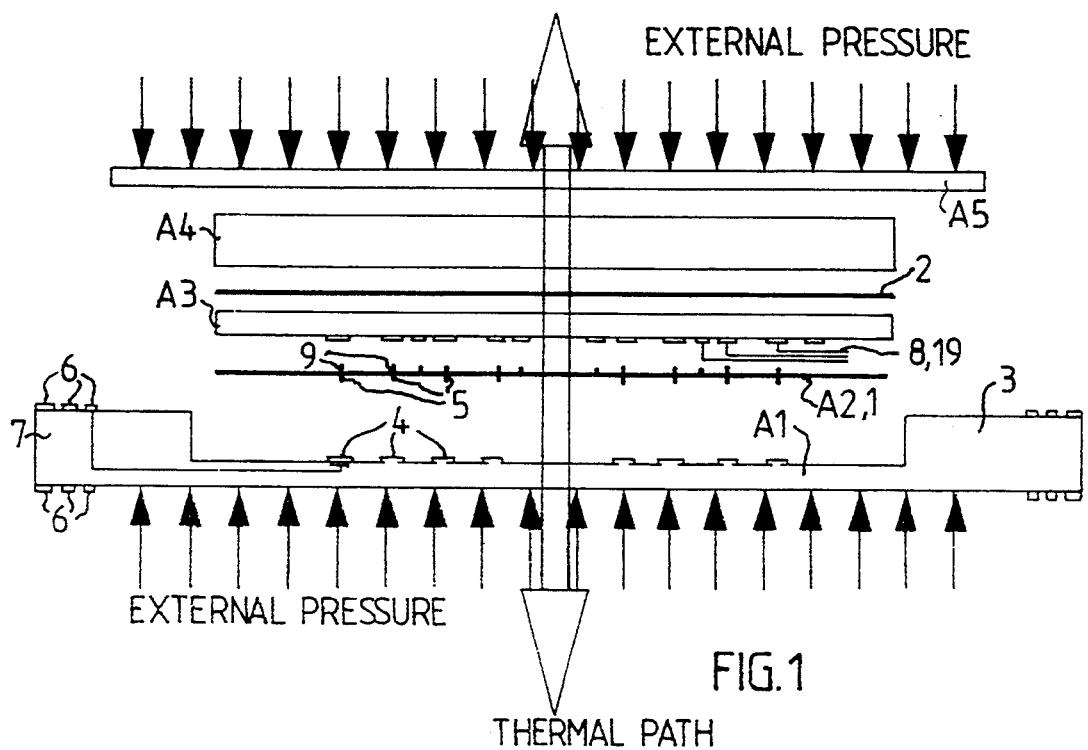
FIG. 1 shows an exploded sectional side view of the first preferred embodiment of a package according to the invention.

The First Preferred Embodiment, FIG. 1

FIG. 1 is an exploded sectional side view showing the package according to the first embodiment of the invention. The five principal components of the package are: a substrate A1, an interconnection film A2, a chip A3 having contact pads on an active surface, a filler A4 and a lid A5. Reference numerals 1 and 2 refer to alpha particle shields.

Figure 13:
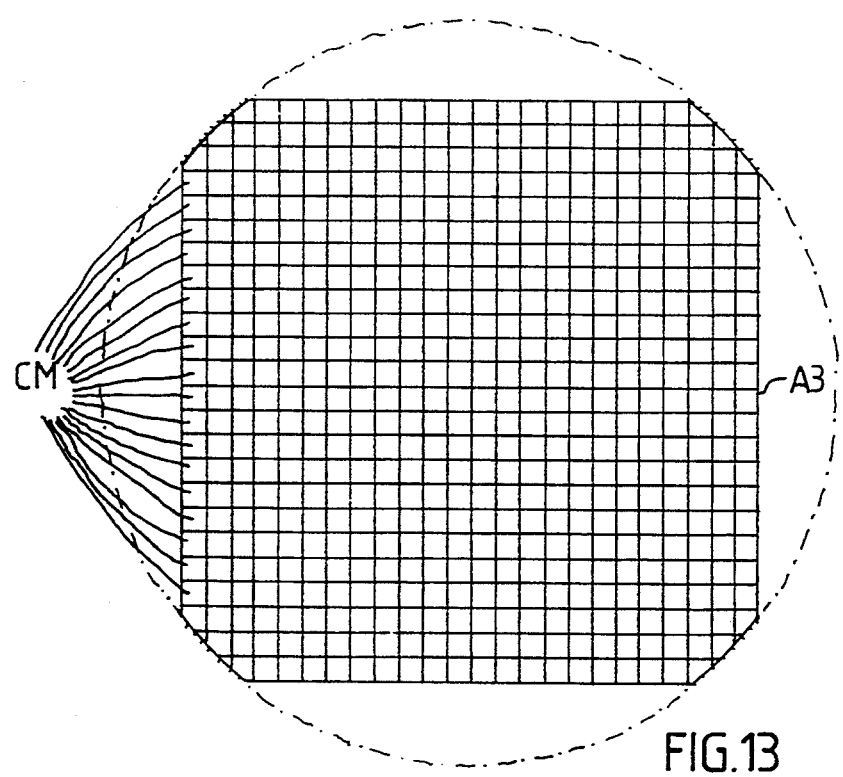
FIG. 13 shows a top view of a wafersized chip with a shape which is suitable for arranging it in a package according to the invention.

The substrate is an element, preferably with a quadratic shape as seen from above, and it is provided with a peripheral frame portion 3 providing a hollow which is generally of a shape similar to the shape of the chip A3, for positioning the chip A3 and the interconnect film A2. Examples of the shape of the chip are shown in FIG. 13 and 15B. The substrate is provided with first pads 4 for contacting corresponding contact elements 5 on the interconnect film.

The first pads 4 on the inside of the package are electrically connected to second pads 6 on the outside of the package for contacting the next level of packaging. Conductors 7 connecting the first pads 4 with the second pads 6 are provided as multilayer thick film conductors on the substrate. Some of the conductors run under isolating ceramic or glass layers. For reasons of simplicity only one conductor 7 is marked in FIG. 1.

Second pads 6 are provided on at least one side of the substrate, and preferably near all four edges of the substrate. These second pads 6 are shown to the far right and to the far left, and on both sides of the package in FIG. 1.

There may be provided conductors (not shown) on the edge of the peripheral frame portion 3 of the substrate A1 for connecting pads 6 on the upper side of the package with conductors 7 or with pads 6 on the lower side of the substrate A1. It is also possible to connect pads on the upper side of the substrate with pads on the lower side of the substrate by through-holes which comprise conductors (not shown).

According to the first embodiment of the invention, which is the preferred one, the substrate A1 with its frame portion 3 provides the bottom-most mechanical support and electrical contacts to the outside. The interconnection film A2 is placed between the chip A3 and the substrate A1. Thus, the chip A3 is mounted face-down, that is with its contact pads 8 facing contact elements 9 on the interconnection film A2.

Some of the contact pads 8 on the chip are situated opposite to the contact pads 4 on the inner side of the substrate A1 in the embodiment shown in FIG. 1. The film A2 has contact elements 9 on its side directed towards the chip A3 and situated opposite to the contact pads 8, and it also has contact elements 5 on its side directed towards the substrate and opposite to the contact pads 4. The contact elements 9 and 5 preferably have the form of bumps having shorter lateral extension than the opposite contact pads to which they will make contact.

FIG. 2

Figure 2:
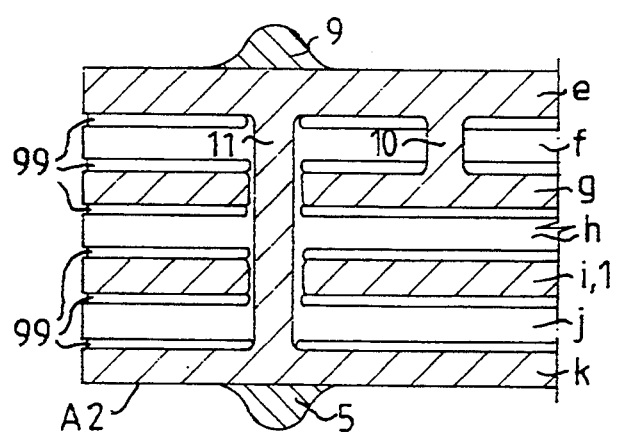
FIG. 2 shows a sectional view of a part of an interconnect film according to the invention.

FIG. 2 shows a sectional view of a part of the interconnection film A2. The interconnection film A2 comprises conductors in four layers e, g, i, k having conductor patterns of metal, and three layers f, h, j of isolating material, such as polyimide between the conductive pattern layers e, g, i, k. Conductors in the first metal layer, marked e in FIG. 2, are provided with metal bumps 9, preferably of gold, for contacting pads on the chip by pressure connect, that is electrical contact is ensured by pressing a chip pad against the corresponding bump 9 on the interconnect film A2. On the opposite surface of the interconnection film, on the conductive pattern layer k, there are metal bumps 5 provided for contacting the first pads 4 on the substrate A1, by pressure connect. The multilayer interconnect film A2 provides contact between the chip pads and the first pads 4 on the substrate A1. The interconnect film may also provide conductors for contact between different pads on the chip A3.

There are many interconnect vias between the top layer and the bottom layer of the interconnect film A2. As shown in FIG. 2, these vias are made like columns 11 of copper providing thermal as well as electric conduction. There is isolator material around the cooling columns 11 ensuring electric isolation from conductors in the intermediate layers. The metal bumps 9 and 5 on the top layer e and the bottom layer k are positioned on the two ends of the column. The metal bumps 9 and 5 are pressed towards the chip and the substrate, respectively. Thereby thermal and electrical conductance is maximized and the temperature drop in the thermal path along the cooling column 11 is kept at a minimum. This is a very important feature. These thermal transport properties could be regarded as a separate invention.

It is to be noted that the column 11 need not be solid, but can be provided as metallized openings through the film A2.

FIG. 3

Figure 3:
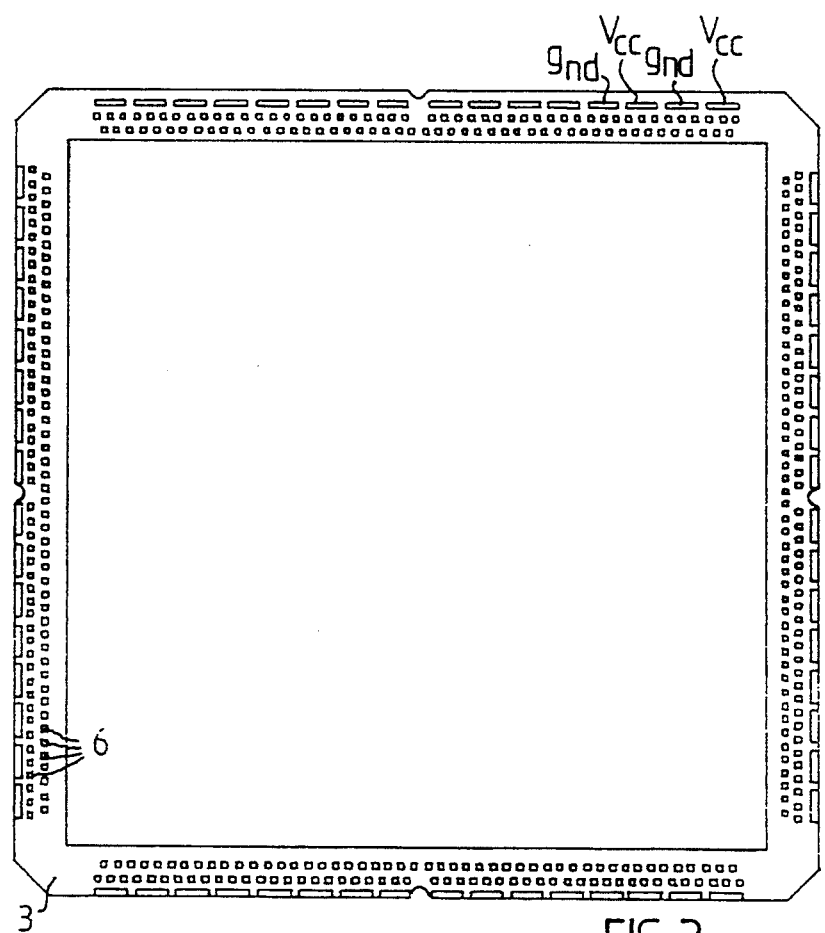
FIGS. 3–4 shows pads and contact surfaces for providing contact to the next level packaging in an embodiment of a package according to the invention.

The external contact pads 6 are placed symmetrically along the perimeter of the package. The upper surface of the frame portion 3 which is shown in FIG. 3 looks similar to the surface on the opposite side of the package. Because of this symmetry a number of advantages are won:

Advantage I: Rotation of the package with respect to its connection to pads on the next level of packaging does not create any short circuits.

Advantage II: The package may be turned upside down with respect to its connection to pads on the next level of packaging without creating any short circuits.

The package according to the first preferred embodiment could comprise 896 external contact pads 6 arranged along the perimeter of the substrate A1, some of which are indicated in FIG. 1. FIG. 3 is a top view showing the arrangement of the external contact pads 6 on the frame portion on the perimeter of the package. These pads may be provided on the substrate or on a separate leader frame. There are three types of pads 6.

I. Power distribution pads Vcc,
II. ground connection pads gnd and
III. data wire pads 12.

The data wire pads 12 are preferably quadratic, while the Vcc pads and gnd pads are preferably larger and have for instance a rectangular shape. The data wire pads are arranged in groups of three. Each group comprises one r-pad, one s-pad and one t-pad, as will be described in detail below. There are 256 groups of data pads on the package and thus there is a total of 768 data pads. On each of the four sides of the package there are 96 data pads, 8 power pads and 8 ground pads facing upwards, as visible in FIG. 3, and the same number of pads facing downwards. Thus there are totally 128 power/ground pads of a rectangular shape on the package and 768 data pads of a quadratic shape. The statements of the number of elements given above are only given as examples. It is to be noted that the contacts on the exterior of the package need not be provided on all sides of the package, but can be provided on only one or two or three sides.

FIG. 4

Figure 4:
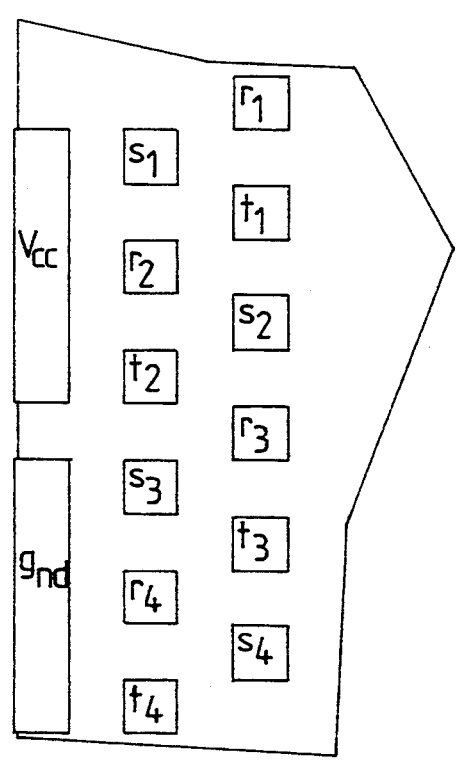

FIG. 4 is a top view showing a part of the perimeter of the laterally protruding frame portion 3 of the substrate A1 on the perimeter of the package from FIG. 1. FIG. 4 shows four groups of data pads, $r_1$, $s_1$, $t_1$ and $r_2$, $s_2$, $t_2$ and $r_3$, $s_3$, $t_3$ and $r_4$, $s_4$, $t_4$. Each data pad group is connected to a data bus comprising three conductors $K_r$, $K_s$, $K_t$, illustrated in FIGS. 5 and 6. Thus the pad $r_1$ is connected to a conductor of type $K_r$, the pad $s_1$ is connected to a conductor of type $K_s$, the pad $t_1$ is connected to a conductor of type $K_t$ the pad $r_2$ to a conductor of type $K_r$ and so on.

FIG. 5

Figure 6:
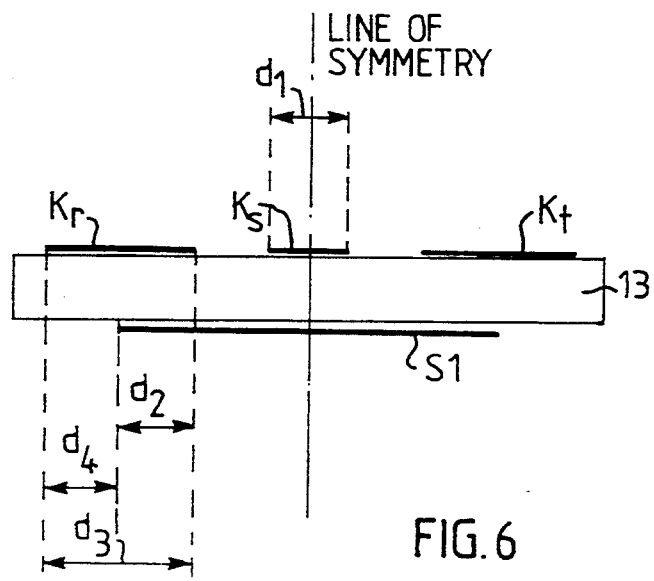
FIG. 6 shows a sectional side view of the three conductors depicted in FIG. 5.
Figure 5:
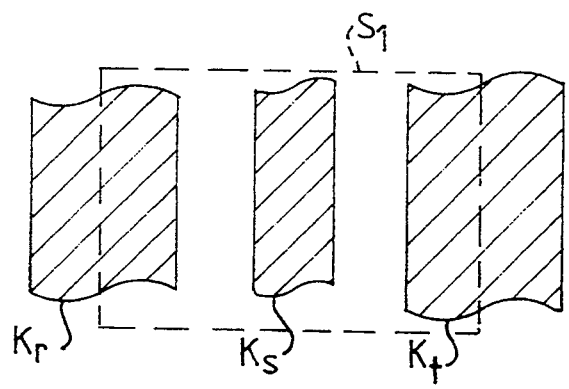
FIG. 5 shows a top view of three conductors provided with a shunt plane for adjusted mutual characteristic impedance.

FIG. 5 shows a top view of a short piece of three planar conductors $K_r$, $K_s$, $K_t$, which may be data leaders, running parallel in the direction marked x in the figure. The conductor $K_r$ to the far left in the Figure has the same width d3 (see FIG. 6) as the conductor $K_t$, to the far right. Both these outer conductors $K_r$ and $K_t$ are wider than the middle conductor $K_s$. Dashed lines in FIG. 5 indicates a conductive shunt plane S1, which is arranged on the other side of an isolating layer below the conductors $K_r$, $K_s$ and $K_t$, as shown in FIG. 6. The sum of the currents and the sum of the voltages, respectively, on the data leaders is preferably constant in time.

FIG. 6

FIG. 6 is a sectional side view showing two layers of conductor material with an isolating material inbetween. FIG 6 is symmetrical on the two sides of an indicated line of symmetry. In the top of FIG. 6 the three conductors $K_r$, $K_s$, and $K_t$ are shown. The conductor $K_s$ has a width d1, which is smaller than the width d3 of the outer conductors $K_r$ and $K_t$. Below the three conductors $K_r$–$K_t$ there is an isolating layer 13 separating them from the conductive shunt plane S1. The shunt plane S1 functions to adjust the mutual capacitance between the conductors, so that the capacitance between Kr and Ks is the same as the capacitance between Kr and Kt and the same as the capacitance between Ks and Kt. The shunt plane stretches a distance d2 in under the conductor Kr. By adjusting the distances d1, d2, d3 and d4 the characteristic impedance can be adjusted, so that the characteristic impedance is of the same value between any combination of conductors in the group $K_r$, $K_s$, and $K_t$. The characteristic impedance depends of the mutual relationship between these distances.

The respective width d1 and d3 of the conductors $K_s$ and $K_r$, $K_t$ respectively may vary along a length of the conductors, but the characteristic impedance of the conductors can still be kept constant. This can be achieved by adjusting the relationship between the distances d1–d4. This is common knowledge among people skilled in the art.

The interconnect film A2 is also provided with conductors according to the above description.

With reference again to FIG. 1, the lid A5, which for example is shaped as a square plate, is placed above the filler material 4 and it provides a tight seal against the frame portion 3 of the substrate A1. The lid A5 is flexible, and in the assembled package it functions as a pretensioned spring pressing the filler material towards the chip.

Since the lid A5 is flexible it allows a pressure from the outside to be transferred to the filler material. The force resulting from the outside pressure also adds to the force pressing the filler material towards the chip. The pressure from the outside may be provided by atmospheric pressure and pressurized cooling heat sinks containing a cooling liquid (not shown). Such heat sinks may be provided on top of the lid, under the substrate or both. Heat sinks of a suitable type are described in our copending application SE 9100596-7. Since the heat sinks are not a part of the package according to this invention they will not be further described here. An alternative source for pressure from the outside is a springloaded piston pressing against the lid A5 of the package. It is also possible to have a lid which is flexible only near the peripheral area where it is resting on the frame part 3 and thus is stiff in a central part (not shown).

The filler material 4 between the chip A3 and the lid A5 functions as a pressure distribution layer. It distributes the pressure over the chip to ensure an even thermal conduction over the whole surface of the chip as well as to ensure electrical contact between chip pads 8 and bumps p15 on the interconnect film A2.

Figure 22:
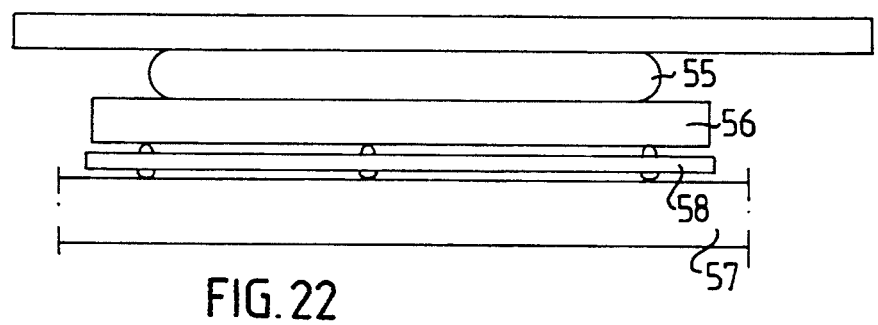
FIGS. 21–23 show different ways of arranging the filler material in a package according to the invention.
Figure 23:
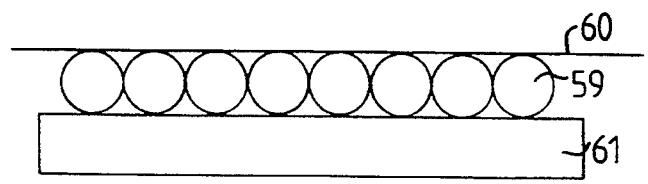
Figure 21:
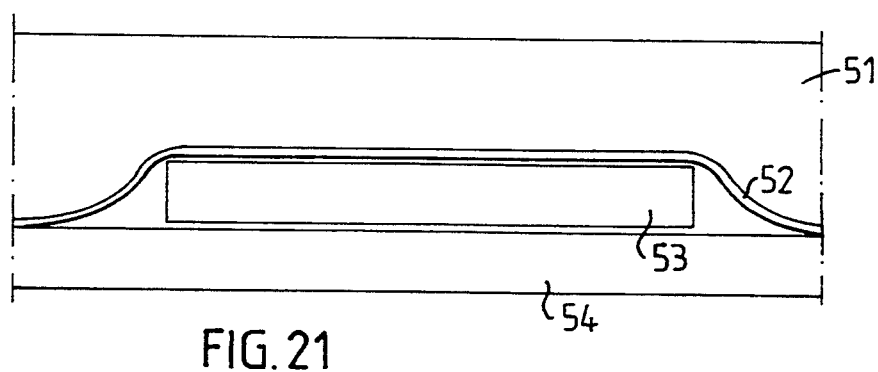

According to an alternative version of the invention the filler material 4 has a certain compressibility or pressure-absorbing ability which is used for distributing the force pressing the chip A3 against the interconnection film A2 evenly over the chip, as shown in FIGS. 21–23, and which will be described in further detail below.

The package provides alpha particle shields 1,2 above the chip as well as below the chip A3 as depicted in FIG. 1. The shield 2 is positioned between the chip A3 and the filler material 4, and may be provided as a metallization on the back of the chip, while the shield 1 is provided for instance as the layer i in the interconnect film A2, in the embodiment shown in FIG. 2. The layer i is thus preferably a layer covering the whole extent of the interconnection film except for openings for connections, such as the column 11, between the conductive pattern layers. Thus the chip is protected from alpha particles that could be emitted from the substrate below by the interconnection film comprising an alpha particle shield 1. The active surface of the chip is protected from alpha particles originating from above by the protective shield 2 between the chip and the lid A5, as shown in FIG. 1. Further protection is provided by the non-active part of the chip itself.

According to an alternative solution the lid A5 comprises an alpha particle shield. An alpha particle shield may comprise materials like polyimide, or a polymer filled with metal particles, or metal, such as for example aluminium or copper.

There are two principal thermal paths in the package, as indicated with arrows pointing out of the package shown in FIG. 1. One thermal path leads from the active surface of the chip, through the interconnection film A2 and through the substrate A1 to ambient. Another thermal path leads from the active surface of the chip A3, through the non-active part of the chip A3, through the alpha particle shield 2, through the filler material 4 and through the lid A5 to ambient. Since interconnection film is provided with metal columns for improved thermal conductivity, and there are two major thermal paths, the resulting cooling of the chip is very efficient.

By letting for instance the substrate, the lid and the filler material in the package comprise similar type of material, for instance ceramic, thermal expansion mismatches are minimized and thus the risk for cracks and leakages in the package is minimized.

In the first preferred embodiment of the invention the lid A5 is approximately 0.8 mm thick, the filler material 4 is 250 $\mu$m thick, and the alpha particle shield 2 is 1 $\mu$m thick. The chip A3 has a thickness of approximately 0.5 mm and the substrate A1 is about 2.0 mm thick. The package according to the first preferred embodiment of the invention comprises 896 external contact pads 6. The area of the cavity in which the chip rests is 124.5*124.5 mm$^2$ and the outer dimensions of the package is 152.4*152.4 mm$^2$. It is to be noted that the dimensions given above only are to be regarded as examples.

There is a more detailed description of the substrate A1, the interconnection film A2, the chip A3, the filler A4 and the lid A5 further down in this specification.

Figure 7:
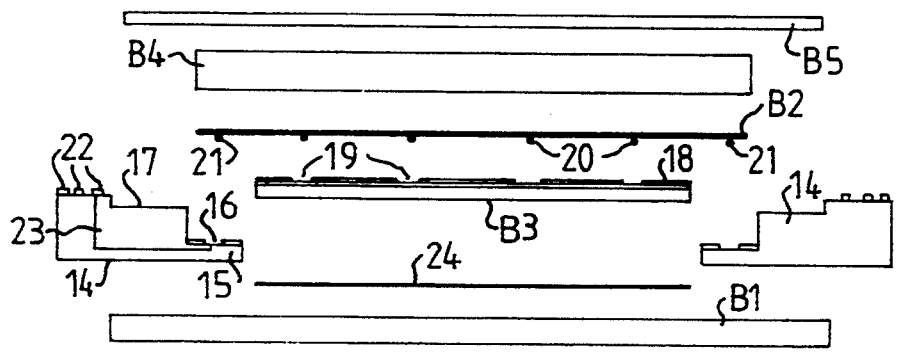
FIG. 7 shows an exploded sectional side view of another embodiment of a package according to the invention.

The Second Embodiment, FIG. 7

Referring to FIG. 7, the second embodiment of the invention includes a separate leader frame 14 mounted on the substrate B1, which is a plate. The substrate B1 provides the bottom-most mechanical support. The chip B3 is, in this embodiment, mounted face-up on the substrate and an interconnection film B2 is on top of the chip. The interconnection film B2 provides electric contact between pads on the chip B3 and pads on the leader frame 14.

The leader frame 14 is a square shaped element with an opening, corresponding substantially to the shape of the chip B3, in the middle. It has a first shelf 15, provided with pads 16, at a height from the substrate B1 which substantially corresponds to the thickness of the chip B3. It has a second shelf 17 which fits for mounting the lid B5 on the leader frame 14.

On top of the interconnection film B2 there is a filler material B4 functioning as a pressure distribution layer. The force pressing the interconnection film against the chip is distributed over the chip by the filler material B4.

In the following description of pads and conductors it is understood that there are a multitude of pads and conductors, but only a few are indicated in FIG. 7 and described here.

The chip B3 is provided with a chip contact multilayer film 18, which is further described later with reference to FIG. 15. Such a chip contact film may also be provided on the chip A3 in the first embodiment, described above. The chip contact film 18 is provided with contact pads 19 for contacting first contact bumps 20 on the interconnection film B2. The first bumps 20 are arranged on the lower surface of the interconnect film B2, as depicted in FIG. 7. The first bumps 20 are individually in contact with second bumps 21, which are arranged along the edges of the lower surface of the interconnect film B2, as depicted in FIG. 7. The second bumps 21 provide electric contact with first leader frame pads 16, which are provided in the leader frame 14.

The first leader frame pads 16 are individually electrically connected to second leader frame pads 22 in the leader frame 14 on the outside of the package via conductors 23, which are buried in the leader frame 14. Contact between pads and bumps is ensured by pressure connect, that is each bump is continually being pressed against the corresponding pad. In order to eliminate the risk that a bump slides away from a corresponding pad during thermal expansion or thermal contraction the pad comprises a larger area than the corresponding bump. A pad 19, 16 is generally slightly higher than the surface surrounding it.

The substrate B1 has a surface directed towards the chip B3, and that surface may not be entirely smooth. This is common when the substrate is made from ceramic materials. Due to the roughness of the surface of the substrate B1 there may be a slight gap between the chip and the substrate. In order to minimize the impact of this gap on the thermal path the roughness of the substrate is kept at a minimum.

According to the second embodiment of the invention the gap is filled by providing a film 24, with a thickness corresponding to the irregularities of the substrate and the chip. The film 24 comprises a lenient material which has good thermal conduction characteristics and which is relatively soft, such as soft metal, for instance gold, or a thermally conductive paste. If the substrate surface has a roughness of 1 μm from the top of a "hill" to the bottom of a "valley" the gold film 24 could be 1 μm thick. When the package is assembled the gold film 24 is squeezed between the chip B3 and the substrate B1. During this process the gold film 24 is deformed and shaped so that it has direct contact with the surface of the chip B3 and direct contact with the surface of the substrate B1. Thus the gap is filled with gold, which provides a very good thermal conduction from the chip B3 to the substrate B1. An alternative material for the film 24 is lead. It is also possible to provide islands of lenient, thermal conductive material between the chip and the substrate instead of a continuous layer.

The lid B5 is placed above the filler material B4 and it provides a tight seal against the leader frame 14. The lid is also used as a spring providing force pressing the filler material B4 towards the interconnection film B2. The interconnection film B2 is pressed towards the chip B3 and, along the edges, towards the leader frame 14.

The chip B3 is protected from alpha particles that could be emitted from the ceramic substrate below by the non-active part of the chip itself and by the film 24. Of course it is also possible to provide a separate protective shield, e.g. comprising a metal layer, between the chip and the substrate. The active surface of the chip is protected from alpha particles originating from above by the interconnection film B2 providing alpha particle shields by comprising metal layers. Further protection is provided by the lid B5, when it comprises metal.

According to an alternative version of the invention the substrate is made of metal, thus eliminating the risk of alpha particle radiation from the substrate and further improving thermal conductivity through the substrate. This version of the invention corresponds to FIG. 7. In this version of the invention the leader frame is preferably made of a ceramic material. Examples of suitable ceramic materials are given later in this specification.

FIG. 8

Figure 8:
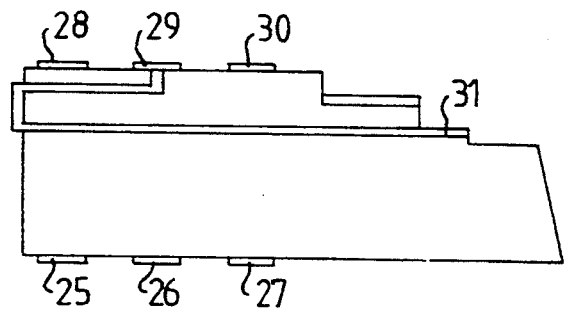
FIGS 8–9 show pads and contact surfaces for providing contact to the interconnect film and to the next level packaging in an embodiment of a package according to the invention.

FIG. 8 shows a sectional side view of an alternative version of a leader frame. The leader frame is provided with external contact pads 25, 26 and 27 outside the package on the lower part of the leader frame for contacting the next level of packaging. There are also external contact pads 28, 29 and 30 outside the package on the upper part of the leader frame for ensuring contact to corresponding contact means in the next level of packaging. The next level of packaging could for instance be a module as describe in our co-pending application SE 9100596-7. The pads 28, 29, 30, 25, 26 and 27 are connected to pads 31 within the cavity of the package for contacting the chip interconnect film B2.

FIG. 9

Figure 9:
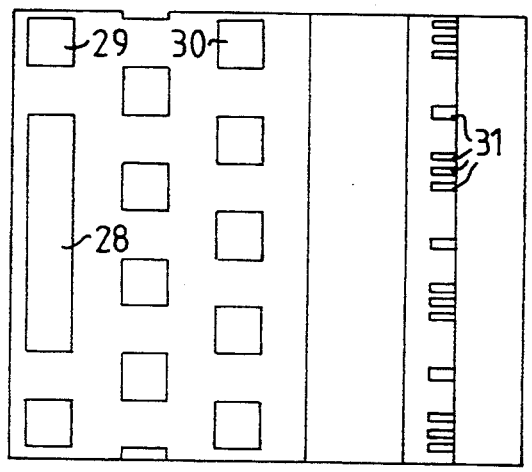

FIG. 9 shows a top view of the leader frame in FIG. 8, with the pads 28, 29 and 30. The pads 31 are electrically connected to pads 28, 29 and 30.

A top view of a leader frame showing the placement of external pads 28, 29, 30 around the perimeter of the package may have the same configuration as pads on a peripheral frame portion 3 shown in FIG. 3 described above.

Figure 10:
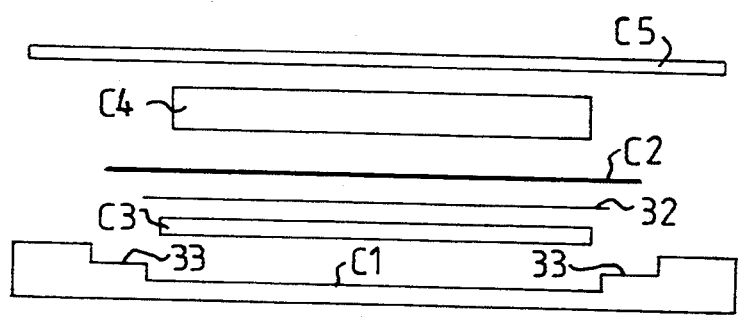
FIG. 10 shows an exploded sectional side view of yet another embodiment of a package according to the invention.

The Third Embodiment, FIG. 10

FIG. 10 is an exploded sectional side view showing the package according to the third embodiment of the invention. The five principal components of the package are: a substrate C1, an interconnection film C2, a chip C3 having contact pads (not shown in FIG. 10) on an active surface, a filler C4 and a lid C5.

Referring to FIG. 10, the third embodiment of the invention bears many similarities with the second embodiment, but the leader frame is integral with the substrate and the package also comprises a sealing foil 32 enabling a pressure difference within the package between the space above the chip C3 and the space under and along the sides of the chip C3. Thus, the chip is secured and fastened against the substrate by low pressure, or vacuum, in the space between chip and substrate. The sealing foil 32 is a thin foil which has a larger area than the chip and which covers the whole chip and which also covers a portion of a first shelf 33 on the leader frame. The sealing foil 32 is eutectic bonded to the upper surface of the first shelf 33, in FIG. 10.

Figure 11:
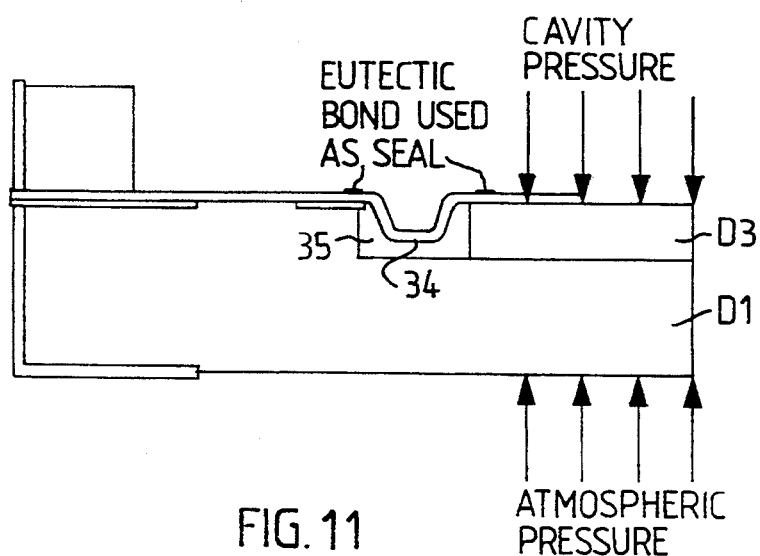
FIG. 11 shows a sealing foil arranged between a substrate and a chip.

There are several alternative ways of embodying such a seal. According to one embodiment the sealing foil is incorporated with the interconnection film and provides electric interconnections as well as providing a tight seal with the substrate (not shown). The sealing foil/interconnection film may cover the whole chip and stretch over to the first shelf on the leader frame, as shown in FIG. 10, or it may be in the form of a stripe stretching from the edge of the chip to a first shelf on a peripheral frame portion, as shown in FIG. 11.

FIG. 11

According to another embodiment there is a separate sealing foil 34, comprising a metallic foil, only along the sides of the chip. The seal could be either along the upper edges of the chip D3 as shown in FIG. 11, or at the base of the chip along the lower chip edges next to the substrate (not shown). With reference to FIG. 11, the seal or foil 34 is eutectic bonded to the chip and to the substrate D1. Thus a space 35 between the chip D3 and the substrate D1 is isolated in a gas tight manner and has a gas pressure, which is below the atmospheric gas pressure and below the pressure in the package cavity above the chip D3 in FIG. 11. The low gas pressures are arranged when assembling the package. Alternatively there is an evacuating means or a vacuum means (not shown) which is arranged to provide the lower gas pressures.

Naturally, it is also possible to attach the seal or foil to the chip and then to a tier or leader frame which is resting on the substrate.

The Fourth Embodiment

According to the fourth embodiment (not shown) of the invention the package comprises a multitude of separate chips which are connected to each other or to the substrate, and from other aspects the package is arranged according to the first preferred embodiment of the invention.

According to one version of the invention the chip is attached to the substrate by gluing or dying. The glue is preferably applied only to a small spot in the central part of a chip. According to yet another version of the invention the chip is kept in place by polymer bonding.

The Fifth Embodiment

According to an alternative version of the invention the package comprises a substrate, a chip having contact pads on an active surface, a filler and a lid, but does not comprise any interconnection film. Instead all interconnections to different circuits on the chip are provided by a multilayer chip contact film, for example a film like 18, shown in FIG. 15. Wire bonding is used for providing contact between the chip pads and the substrate pads. An illustration of this bonding is made in FIG. 19 and is described further below.

In this embodiment (See FIG. 19) the chip is mounted face up on the substrate. The substrate is provided with first bond pads for wire bonding to the chip pads. These first bond pads on the substrate are arranged in a square pattern around the perimeter of the chip. These first bond pads on the substrate are connected to second contact pads or pins (not shown) on the outside of the package for contacting the next level of packaging, e.g. a module.

The filler material does not cover the whole chip, but leaves an open space along the edges of the chip, so that there is space for bond wires. On top of the filler material the lid is arranged.

Thus, the fifth embodiment of the invention provides a package where the chip is kept in place by being squeezed between the filler and the substrate.

Figure 12:
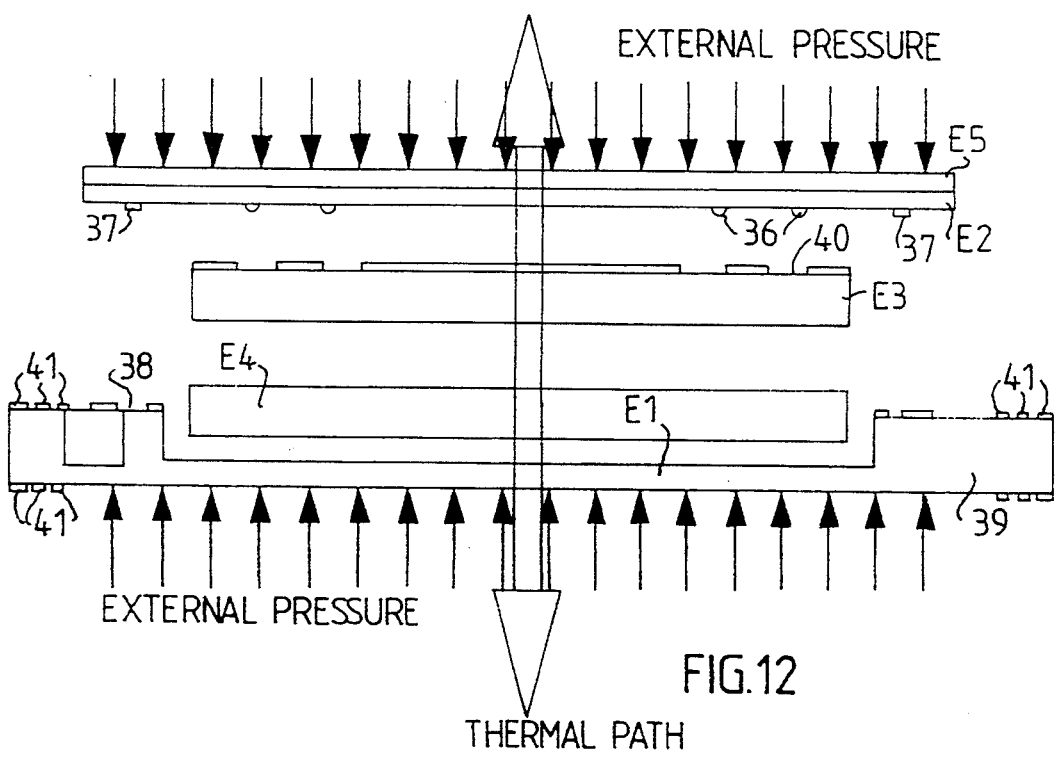
FIG. 12 shows an exploded sectional side view of yet another embodiment of a package according to the invention.

The Sixth Embodiment, FIG. 12

According to the sixth embodiment of the invention the interconnection film is integral with the lid. FIG. 12 is an exploded sectional side view showing the package according to the sixth embodiment of the invention. A lid E5 is, on its lower side in FIG. 12, provided with an interconnection film E2 having first contact areas 36, preferably in the shape of bumps. A chip E3 is positioned between the substrate E1 and the lid E5. Between the chip E3 and the substrate E1 there is filler material E4, functioning as a pressure distribution layer.

The chip E3 is provided with contact pads 40 for making contact with the contact areas 36 on the lid E5. The bumps 36 are individually in contact with second contact areas 37 situated on the surface directed towards the substrate E1 along the periphery of the lid. When the package is assembled the contact areas 37 make contact with third contact areas 38, which are provided on a peripheral frame portion 39 of the substrate E1.

The third contact areas 38 are electrically connected to external contact pads 41 on the outside of the package.

It is understood that many combinations and variations of the above embodiments are possible within the scope of the invention.

DESCRIPTION OF COMPONENTS IN THE PACKAGE

THE SUBSTRATE

Substrate Mechanical Aspects

The substrate provides the lower mechanical support for the chip as well as functioning as a thermal conducting path between the chip and ambient.

The substrate is constituted by a ceramic such as alumina ($AL_2O_3$), or some other material with a relatively good thermal conductivity e.g. a metal, an alloy, a polymer or a polymer composite. Among other possible ceramics are silicon nitride, silicone carbide, aluminium nitride or some sort of glass ceramics.

Substrate Electrical Aspects

The substrate provides conductors for electric contact between the interconnect film and the housing or module in which the package is mounted. The substrate is provided with multilayer thick film conductors with pads for contacting the interconnection film, the conductors being described above in relation to FIGS. 5 and 6. The ceramic substrate is preferably produced by cofiring technique.

Electric contact between the interconnection film and the substrate may be achieved by pressure connects, wire bonding or thermo-compression bonding. Alternatively contact may be achieved by welding or soldering.

Electric contact between the substrate conductor pads 6 and the module is preferably achieved by pressure connects or more specifically floating connectors. Alternatively contact may be achieved by welding or soldering.

Within the scope of the invention it is also possible to provide the package with pins which are mechanically arranged on the substrate for contacting conductors in a housing or module.

Substrate Thermal Conduction Considerations

It is important that the substrate has a high thermal conductivity, since one of the functions of the substrate is to transfer heat from chip to ambient. Ordinary alumina has a thermal conductivity k of about 18 watts/-Kelvin meter [W/(K*m)].

Due to the roughness of the surface of the substrate there may be a slight gap between the chip and the substrate. In order to minimize the impact of this gap on the thermal path the roughness of the substrate is kept at a minimum. The substrate may be polished in order to be very smooth. This gap is either filled with nitrogen or helium. Alternatively the gap may be evacuated.

The gap may also be filled by providing a gold film, with a thickness corresponding to the irregularities of the substrate and the chip. If the substrate surface has a roughness of 1 µm from the top of a "hill" to the bottom of a "valley" the gold film could be 1 µm thick. When the package is assembled the gold film 24 is squeezed between the chip B3 and the substrate B1. During this process the gold film is deformed and shaped so that it has direct contact with the surface of the chip B3 and direct contact with the surface of the substrate B1. Thus the gap is filled mostly with gold, which provides a very good thermal conduction from the chip to the substrate. It is to be noted that also other soft materials with relatively good thermal conduction may be used.

Substrate Thermal Expansion Considerations $Al_2O_3$ has a thermal coefficient of linear expansion equal to $7.0*10^{-6}K^{-1}$. For silicon it is $2.33*10^{-6}K^{-1}$, and thus there is a mismatch of $4.67*10^{-6}K^{-1}$.

THE CHIP

The package according to the invention is not limited to a package for chips of conventional size, but the term "chip" is used for one body of semiconducting material comprising at least one integrated circuit module. In the first preferred embodiment of the package according to the invention the body of semiconducting material may comprise 552 circuit modules. A large chip according to the invention is a wafer with size in the magnitude of square decimeters.

Figure 15:
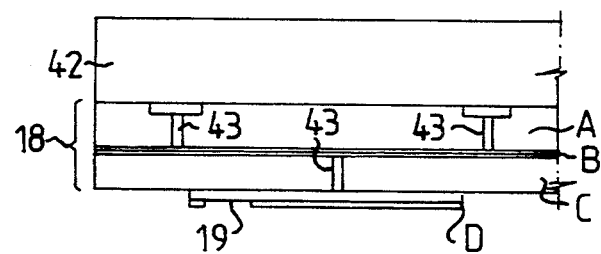
FIG. 15 shows a sectional view of a part of a chip contact film according to the invention.

The chip A3 comprises a semiconductor VLSI-chip body 42 and the chip may be provided with a chip contact film 18, as shown in FIG. 7 and in more detail in FIG. 15. The VLSI-chip body 42 comprises an array of circuit modules CM. The individual circuit modules CM, indicated in FIG. 13, can be mutually interconnected by the chip contact film 18.

The circuit modules CM may comprise memory modules, processor modules, or other electronic circuits as well as a combination of different types of circuits. The circuit modules CM may be arranged as an array of 24*24 modules, an array of 8*8 modules, an array of 2*2 modules or one single module. Between the individual circuit modules there may be scribed channels.

FIG. 13

Very large VLSI-chips, like the wafersized chip which is depicted in FIG. 13, have rounded corners in order to reduce the risk of breakage. The chip A3 in FIG. 13 comprises an array of 24*24 circuit modules CM. There are 6 modules in each corner which cannot be used because of this. The remaining number of functionable circuit modules CM in the wafer 3 is 552 (24*24−6*4).

FIG. 14

Figure 14:
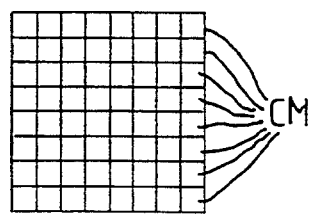
FIG. 14 shows a top view of a chip in a shape which is suitable for arranging it in a package according to the invention.

FIG. 14 shows a top view of a square chip comprising an array of 8*8 circuit modules CM.

FIG. 15

With reference to FIG. 15, the first preferred embodiment of the invention the chip contact film 18 comprises the following layers, as listed from the semiconductor VLSI-chip and up:

A) An isolating polymer film A of for instance 1 µm thickness. It has openings with conducting vias 43 for providing electric contact between pads on the semiconductor VLSI-chip body 42 and conductors in the chip contact film 18.
As an example for an object memory module of 5*5 mm², which has 10 power pads and 16 signal pads, the polymer film has 26 openings.

B) A conducting layer B of for instance 100 nm−1 µm thickness. This layer consists of an aluminium film and it may be used for interconnecting all power supply pads in a vertical line on the chip. It may also provide wires between the chip pads and contact vias connected to the next conducting layer, the D-layer.

C) A isolating polymer film C of for instance 1 µm thickness. It has openings for all interconnects.
As an example for an object memory module of 5*5 mm², which has 10 power pads and 16 signal pads, this polymer film has 20 openings, i.e. 4 power openings and 16 signal pad openings, for providing electric contact with conductors in the chip contact film 18.

D) A conducting layer D of 100 nm thickness. This layer may consist of an aluminium film and it may be used for interconnecting all power supply pads in a horizontal line on the chip. It also provides contact pads 19 for contacting bumps 9, 20 on the interconnect film A2, B2.
As an example for an object memory module of 5*5 mm², the d-layer has 20 vias i.e. 4 power vias and 16 signal vias for contacting the b-layer. It also provides 20 pads, related to each object memory module, for contacting the corresponding bumps the interconnect film.

The above layers are joined to the VLSI-chip by building the layers on top of a prefab wafer with methods known to people skilled in the art. The conductive layers can be deposited by for example Physical Vapor Deposition or Chemical Vapor Deposition.

In the first preferred embodiment of the invention the material in the conductive layers is aluminium. It is, however, within the scope of the invention to use other electrically conductive materials, e.g. copper, gold, kovar or molybdenum.

Chip Mechanical Considerations and Thermal Expansion Aspects

For large chips of one square decimeter in area it is very important to consider the thermal expansion mismatch between the materials resting on each other. $Al_2O_3$ has a thermal coefficient of linear expansion equal to $7.0*10^{-6}K^{-1}$. For silicon it is $2.33*10^{-6}K^{-1}$, and thus there is a mismatch of $4.67*10^{-6}K^{-1}$. The elastic constants for the materials are $27*10^9$ Pa and $16.7*10^9$ Pa, respectively. This results in a tension in the silicon of 126 kPa/K if the materials are rigidly joined to each other when there is a change in the temperature. Thus attaching the chip rigidly to the substrate may result in that the chip cracks or is teared apart when temperature increases in the package.

In order to prevent these mechanical stress problems the bond to the substrate is flexible. In the first embodiment of the invention this is achieved by simply letting the chip rest on the substrate without any adhesives. The chip A3, B3 is kept in place by being pressed towards the substrate. The force pressing the chip A3, B3 towards the substrate is provided by the material between the chip A3,B3 and the lid A5, B5.

According to another embodiment of the invention the chip is kept in position by an underpressure in the gas or liquid between the chip and the substrate. In that embodiment there is a tight seal around the edges of the chip, or cavity in which the chip is placed, in order to preserve the underpressure and see to that there is a pressure difference between the material above the chip and the gap under the chip. The provided underpressure may even be vacuum. The force of the pressure difference together with friction keeps the chip in place.

When the force on the chip is such that the pressure is 100 kPa the friction between the chip and the substrate is still negligible when compared to the thermal forces.

Chip Electrical Aspects

A chip may be provided with a chip contact film with multilayer conductors for contacting the chip pads and providing pads for contacting the interconnection film by pressure connect.

The chip A3, according to the first embodiment of the invention, comprises a chip contact film 18 having a multitude of pads 8, 19. The number of pads 8, 19 providing contact between the chip contact film and the interconnection film exceeds 1200 in the first embodiment of the invention. This is possible by using pressure connects and thus eliminating thermal stress problems. It is possible to achieve that many connections because the chip is large enough to provide sufficient space for so many pads.

The chip may have pads anywhere on the active side for contacts with the chip contact film. This is an important feature since it makes it possible to use very large chips and it eliminates the necessary to locate the pads only along the periphery of the chip. This naturally simplifies the VLSI-design.

As mentioned above, one chip may consist of a whole wafer. The wafer may contain one large circuit, an array of identical circuits or a multitude of different circuits.

Since the chip design is not a part of the actual package according to the invention it will not be described further.

Chip Thermal Conduction Aspects

Silicone has a thermal conductivity k of about 125 W/(K*m)].

Most of the heat in the chip will be produced near the side of the chip with an active surface and contact pads. There are two main thermal paths from there.

For the face-up version they are: Up through the interconnection film and filler towards the lid, and down through the non-active part of the chip towards the substrate.

For the face-down version they are: Down through the interconnection film to the substrate, and up through the non-active part of the chip and through the filler towards the lid.

In both cases there will be temperature gradients at the interfaces between the components of the package.

THE INTERCONNECTION FILM

The interconnection film comprises one or several layers of polymer film with one or several layers of electrical conductors. The interconnection film provides electric contact between the chip contact film and the substrate or "the world outside the package".

Figure 16:
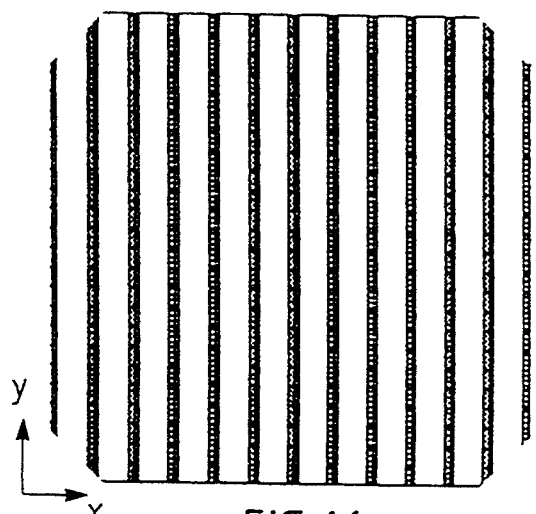
FIGS. 16–17 shows conductors in two mutually perpendicular directions in two different conductor layers of an interconnection film according to the invention.
Figure 17:
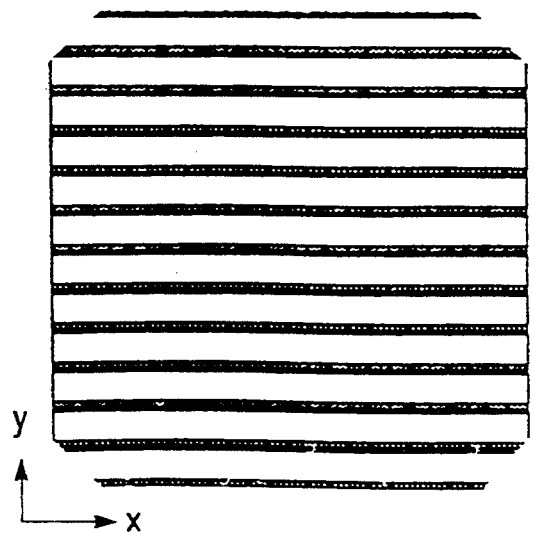

FIGS. 16 and 17

FIG. 16 shows a top view of conductors for instance in the conductor layer g in an interconnection film. This layer g may comprise a multitude of conductor lines, all directed in the y-direction, as indicated in FIG. 16. There may be vias 10 (not shown) for contacting other layers in the interconnection film. FIG. 17 shows a top view of for instance the conductor layer k in an interconnection film. This layer k may comprise a multitude of conductor lines, all directed in the x-direction, as shown in FIG. 17.

In the first preferred embodiment of the invention the materials in the conductive layers are gold and copper. Gold is used in contact bumps (See for instance FIG. 2). It is, however, within the scope of the invention to use other electrically conductive materials, e.g. gold, kovar or molybdenum.

Figure 18:
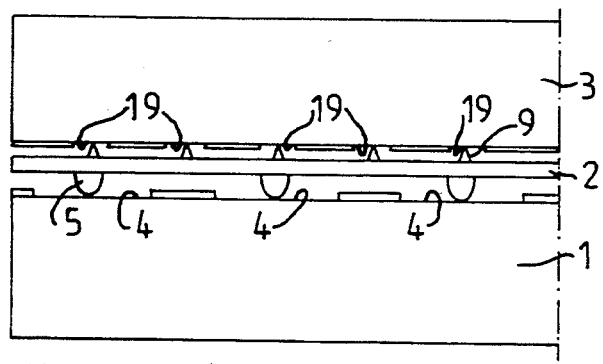
FIG. 18 shows contact between the interconnect film and the substrate provided by pressure connects by bumps in an embodiment of a package according to the invention.
Figure 19:
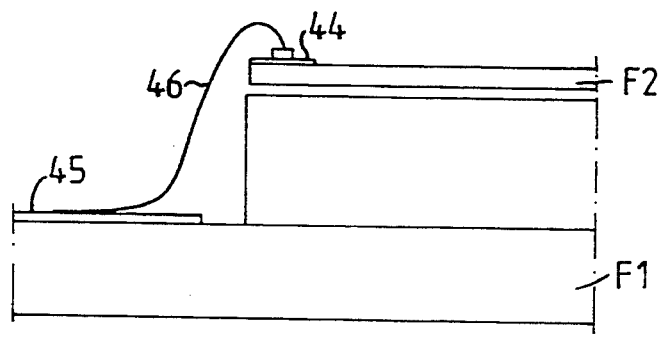
FIG. 19 shows contact between the interconnect film and the substrate provided by wire bonding in an embodiment of a package according to the invention.
Figure 20:
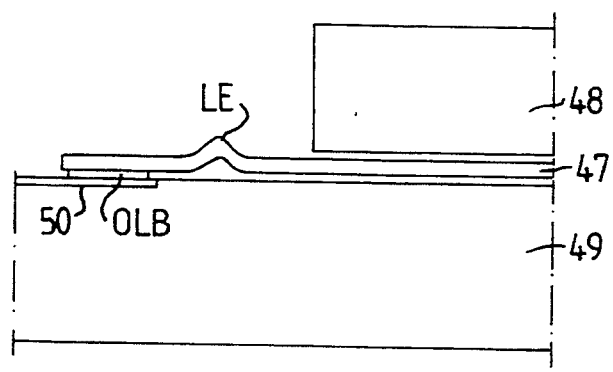
FIG. 20 shows contact between the interconnect film and the substrate provided by OLB in an embodiment of a package according to the invention.

The interconnection film can be provided in several different ways, as shown in FIG. 18, 19 and 20.

FIG. 18

FIG. 18 shows a sectional side view of a part of the substrate A1, a part of the interconnect film A2 and a part of the chip A3, arranged according to the first embodiment, shown in FIG. 1. In the first embodiment the interconnection film A2 covers the whole chip A3 and electric contact between chip contact film pads 19 and conducting bumps 9 in the interconnection film is accomplished by continuously pressing them together (pressure connect). The area of a pad 19 is much larger than the contacting area of a corresponding bump 9, and thus the bump 9 can slide laterally within the pad 19 and still maintain ohmic or electrical contact with the pad 19. Bumps may be caused to slide because of thermal expansion mismatch between the chip A3 and the interconnect film A2.

The area of a pad 4 of the substrate A1 is for similar reasons larger than the contacting area of a corresponding bump 5, and electric contact between the bumps 5 on the interconnection film A2 and the pads 4 on the substrate A1 is accomplished by sliding bumps 5 ensuring electric contact by pressure connects. In the preferred embodiment, as shown in FIG. 18, the chip is mounted face down.

FIG. 19

Electric contact between an interconnection film F2 and a substrate F1 can also be achieved by wire bonding, as shown in FIG. 19. The interconnection film F2 covers the whole chip and it is provided with pads 44 along the edges of the interconnect film F2. The substrate F1 is provided with pads 45 connected to external pads on the package. Electric contact between an interconnection film pad 44 and a pad 45 on the substrate F1 is provided by a bond wire 46. Electric contact between chip contact film pads and conducting bumps in the interconnection film is accomplished by pressure connects (not shown). In this embodiment the chip is mounted face up.

FIG. 20

According to another aspect of the present invention electric contact between the interconnection film and the substrate is achieved by outer lead bonding, as shown in FIG. 20.

Alternative ways of providing contact between the interconnection film and pads on a substrate are welding or soldering.

The interconnection film 47 comprises a larger area than the chip 48 and the interconnection film 47 is provided with contact areas suitable for OLB along the edges of the interconnect film 47. The substrate 49 is provided with pads 50 connected to external pads on the package. Electric contact between an interconnection film contact area suitable for OLB and a pad 50 on the substrate 49 is provided by OLB. The interconnection film 47 is provided with an excess length LE so that contraction and expansion can take place without causing thermal stress problems.

It is obvious, however, that OLB can be used, with the same result regarding thermal stress problems, also when the chip is mounted face up.

Electric contact between chip contact film pads and conducting bumps in the interconnection film is accomplished by pressure connects (not shown). In this embodiment the chip is mounted face down, i.e. with its active surface down towards the substrate 49.

Interconnect Film Mechanical Aspects

In the first preferred embodiment of the invention the interconnection film comprises four layers e, g, i, k, of conductors and three isolator layers (compare with the chip contact film described above).

Referring back to FIG. 2 in which a section of a small part of the interconnection film A2 is shown, the interconnection film comprises the following layers:

e) A conducting layer e of for instance 7 μm thickness. This layer comprises a multitude of different conductor lines and some of them are provided with bumps 9 for contacting pads p19 on the chip contact film 18 (see FIG. 1, FIG. 15, FIG. 2). There are vias 10, 11 for contacting other layers in the interconnection film. Some of these vias provide metal columns 11 running straight through the interconnection film to the bottommost conductive layer in FIG. 2, the k-layer.

In the area of the interconnect film directly over an object memory module of 5*5 mm², which has 10 power pads and 16 signal pads, the e-layer comprises 4 power bumps and 16 signal bumps.

f) An isolating polymer film of for instance 25 μm thickness. It is provided with openings for vias 10, 11.

In the area of the interconnect film directly over an object memory module of 5*5 mm², which has 26 pads, this polymer film comprises 20 openings, i.e. 4 power openings and 16 signal pad openings, to allow contact between the conducting e-layer and the conducting g-layer.

g) A conducting layer of for instance 27 μm thickness.

This layer g comprises a multitude of 15 mm wide conductor lines. There are vias 10 for contacting other layers in the interconnection film.

h) An isolating polymer film of for instance 25 μm thickness.

This polymer film has openings for vias 10, 11 to allow contact between the conductors in the g-layer and conductors in the i-layer.

i) A conducting layer of for instance 26 μm thickness. This layer provides a ground plane. This layer comprises a metal sheet with the same area as the area of the chip, but it has openings to allow for contact between conductors in other layers without contacting the ground plane, e.g. contact between the g-layer and the k-layer without electrically contacting the i-layer (not shown). As shown in FIG. 2 there are also openings for cooling columns 11. This layer i also function as an alpha particle shield 1, as indicated in FIG. 1. In the preferred embodiment this layer comprises a 20 μm kovar layer covered on the upper surface and the lower surface with 3 μm layers of copper.

j) An isolating polymer film of for instance 25 μm thickness.

This polymer film has openings with vias 10, 11 to allow contact between conducting layers.

k) A conducting layer of for instance 7 μm thickness. This layer k comprises a multitude of 15 mm wide conductor lines. There are vias 10, 11 for contacting other layers in the interconnection film A2. There are bumps 5 attached to the k-layer to provide pressure connects to pads 4 on the substrate.

The conducting layers are attached to the isolating layers with approximately 20 μm thick layers of adhesive 99 placed between each conducting layer e, g, i, k and the corresponding isolating layer f, h, j. Each metal layer may comprise a central metal layer covered on the upper surface and the lower surface with thinner layers of metal with better electric conductivity.

Important properties of the material in the conductor layers are thermal expansion, thermal conductivity and electric conductivity.

In the first preferred embodiment the polymer is polyimide, and the conductive layers comprise copper and kovar while the bumps 9, 5 comprise gold. It is also within the scope of the invention to use aramid in some or all the isolating layers. Alternative conductor materials comprise invar or molybdenum metal.

In the second embodiment of the invention the multilayer interconnection film provides contact with the chip B3 and with the leader frame 14 by contact areas which are all situated on the same surface of the interconnect film, as described with reference to FIG. 7 above.

Interconnect Film Electrical Aspects

Power supplies, ground connections and signal distribution is handled by the four electrically conducting layers, as shown in FIG. 2. One layer i provides a ground plane and ground connections and the other layers e,g,k provide power supply and signal distribution. Power distribution supplying high currents to pads on a chip is made possible with the interconnection film In the first preferred embodiment of the invention the interconnection film provides connections from the wafer-sized chip to the thick film pads 4 on the substrate.

The interconnect film may also be provided with conductors of the type described with reference to FIG. 6 and FIG. 5 above.

Interconnect Film Thermal Expansion Aspects Polyimide has a thermal coefficient of linear expansion of about $200*10^{-6}K^{-1}$ and aramide has a thermal coefficient of linear expansion of about $6*10^{-6}K^{-1}$. The polymers are, however, elastic and for that reason the thermal expansion is not as critical as for the metals.

Copper has a thermal coefficient of linear expansion of about $18*10^{-6}K^{-1}$ and aluminium has a thermal coefficient of linear expansion of about $25*10^{-6}K^1$.

A layer comprising kovar and copper, such as the above described i-layer, has a thermal coefficient of linear expansion of about $7*10^{-6}K^1$, thus matching alumina.

In the first embodiment of the invention the interconnect film is kept in place by being pressed between the chip A3 and the substrate A1. Electrical connections are made by pressure connects and thus the bumps 9 of the interconnection film can slide over the larger pad areas 8 on the chip contact film in case of thermal expansion mismatch, but still maintain electric contact. According to the first embodiment also contacts between the substrate and the interconnection film is achieved by pressure connect.

According to another embodiment electrical connections between chip contact film and the interconnection film are made by pressure connects, but electrical connections between contact areas on the interconnection film and contact areas on the substrate are achieved by bonding, e.g. thermo compression bonding, welding or soldering. The interconnection film is arranged to be elastic enough to be attached at several points to the substrate and still not break if excerted to thermal expansion mismatches.

Interconnect Film Thermal Conduction Aspects

Polyimide has a thermal conductivity k of about 0.25 W/(K*m).

Thermal conductivity for the metal layers is better than 200 W/K*m. For aluminium k=205 W/(K*m) and for copper k=398 W/K*m.

There are many interconnect vias between the top layer and the bottom layer. As shown in FIG. 2, these vias are made like columns 11 comprising a material with high thermal conductivity, for instance copper providing thermal as well as electric conduction. There is isolator material around the cooling columns 11 ensuring electric isolation from conductors in the intermediate layers. The top layer e and the bottom layer k are provided with metal bumps 9, 5, positioned on the two ends of the column. These bumps 9 and 5 are arranged to press against the pad areas on the chip contact film 8 and the pad areas on the substrate 4 respectively. Thereby thermal and electrical conductance is maximized and the temperature drop in the thermal path along the cooling column 11 is kept at a minimum.

According to an alternative embodiment of the invention the bumps 9 and 5 on the interconnection film press against non-pad areas of the chip and the substrate, respectively, and the vias 11 function only as thermal paths.

THE FILLER

The chip is kept in place by a continuously applied force pressing it from the lid towards the substrate. The object of the filler is to distribute that force over the surface of the chip, and press each chip contact film pad against the corresponding bump on the interconnection film. The interconnection film bumps are also pressed against the corresponding pads on the substrate by force from the compressed filler.

Example I. The filler material 4 comprises ceramics, as in the first preferred embodiment shown in FIG. 1. When the filler consists of ceramics the lid has to be flexible in order to function as a spring providing a force pressing the filler towards the chip, and pressing the chip, the interconnect film and the substrate close together. The lid can comprise a thin metal or a thin layer of ceramics.

According to other embodiments of the invention the material in the filler is elastic or flexible.

FIG. 21

Example II: The filler material comprises a gel 51, as illustrated in FIG. 21. There is a film seal 52 arranged in between the chip 53 and the gel 51, so that there is no physical contact between the chip and the gel. The gel distributes the pressure from the lid (not shown) over the chip 53 and also presses the film seal 52 towards the chip and towards the substrate 54. According to one version of the invention the film seal 52 comprises an interconnect film with contact means, which achieves pressure connects to pads on the chip and on the substrate (not shown). The seal preferably comprises polymer, but other materials, e.g. metal, are within the scope of the invention. The gel preferably is conductive by including a conductive material, e.g. silver. Thus it provides a good cooling path from chip to lid (not shown).

FIG. 22

Example III. The filler material comprises a polymer 55, as illustrated in a sectional side view in FIG. 22. The polymer distributes the pressure from the lid (not shown) over the chip 56 and presses the chip towards the substrate 57. An interconnect film 58 is provided in between the chip and the substrate. The polymer does not cover the chip all the way out to the edges. The polymer could comprise silicone filled with boron nitride.

FIG. 23

Example IV. The filler material comprises cushions 59 filled with gas, as illustrated in FIG. 23. The cushions may be situated between the lid 60 and the chip 61. According to one version of this embodiment the cushions comprise thin metal film tubes, which are filled with gas.

THE LID

Lid Mechanical Aspects

The lid provides the upper mechanical support and protection for the chip as well as functioning as a thermal conducting path to ambient.

In the first preferred embodiment of the invention, shown in FIG. 1, the lid A5 is flexible so that it allows a pressure from the outside to be transferred to the filler material. It also functions as a spring providing a pressing force to the filler material which is in between the lid and the substrate.

The lid is stiff in one version of the invention, providing stable support for the elastic filler material under the lid.

The lid comprises a metal such as kovar or a ceramic such as alumina, or another material with a relatively good thermal conductivity e.g. an alloy. The lid may also comprise a polymer or a polymer composite.

Lid Thermal Aspects

Thermal-coefficient of linear expansion and thermal conduction for materials possible for the lid have been described earlier in the text.

FIG. 24

A separate seal ring may be provided in a package for providing a gas tight seal between two parts, e.g. a lid and a substrate, that are joined to each other.

Figure 24:
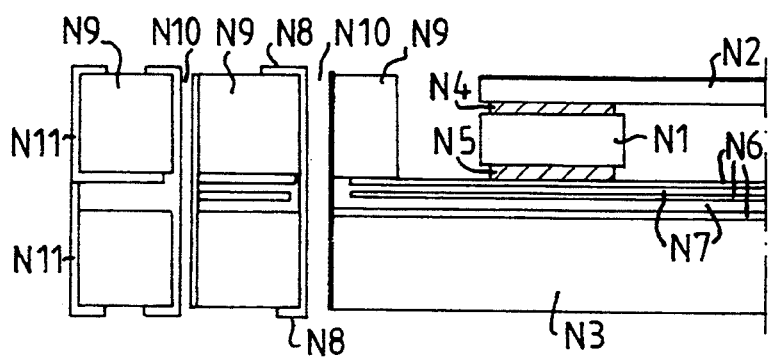
FIG. 24 shows a seal ring according to an embodiment of a package according to the invention.

FIG. 24 is a sectional side view showing a seal ring N1 positioned between a lid N2 and a substrate N3. A seal ring N1 may be provided in a package for providing a gas tight seal between two parts that are joined to each other. The seal ring may be provided as a ceramic material, like the material in the substrate which has been described earlier in this specification. By letting for instance the substrate, the lid and the filler material in the package comprise similar type of material, for instance ceramic, thermal expansion mismatches are minimized and thus the risk for cracks and leakages in the package is minimized.

In the joint between the seal ring N1 and the lid N2 there is provided a binder N4. Binder N5 is also provided in the joint between the substrate N3 and the seal ring N1. The material in the binder N4 or N5 may comprise glass. Alternatively the binder N4 or N5 may comprise an amalgam based on gallium.

Between the substrate N3 and the glass binder N5 there may be provided multilayer thick film conductors N6 with isolating layers N7 between the individual conductors. The conductors N6 may provide electric contact between the inside cavity of the package and external contact pads N8. Thus, for example the pads 4 in FIG. 1 may be connected to the conductors N6. The external contact pads N8 may be provided on the lower surface of the substrate N3, as shown in FIG. 24, and on the upper surface of a separate leader frame N9. The leader frame N9 may be provided with one or several through holes N10, which may be plated with thick film conductors for providing contact between the thick film conductors N6 and the pads N8. The substrate N3 may also be provided with through holes N10, as well as with conductors N11 on the edges for providing contact between pads N8 and conductors N6.

TOTAL THERMAL CONDUCTION FROM CHIP TO AMBIENT

The package is cooled by providing either heat sinks on top of the lid or under the substrate or both. The heat sinks are provided in the module in which the package can be mounted. Since the heat sinks and the module are not part of the actual package according to this invention it will not be described further. For further information about the module we refer to our copending patent application SE 9100596-7.

Thermal conduction from the package is ensured by an external pressure squeezing the package between the heat sinks. A matching internal pressure in the package is provided to compensate for the external pressure and prevent deformation of the package. As the package may be exerted to pressures up to 1 bar there is a considerable force on the lid and the substrate. A package having a lid size of 122 mm * 122 mm could be exerted to 1400N.

FIG. 25

Figure 25:
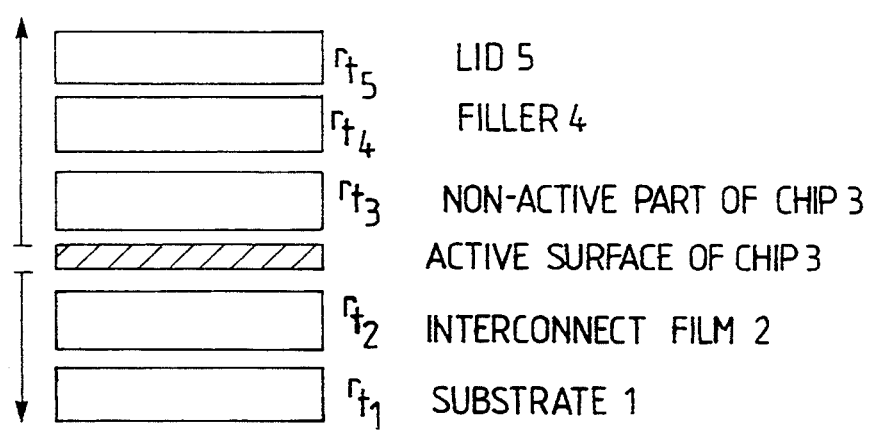
FIG. 25 shows the main thermal paths from heat source to ambient in an embodiment of a package according to the invention.

In FIG. 1 the two principal thermal paths from the active surface of the chip A3 to ambient are indicated by arrows. FIG. 25 illustrates the same thermal paths and indicates the corresponding resitivity to heat conduction $r_{t1}$ to $r_{t5}$. With reference to FIG. 25, the following table shows the approximate thermal resistivity $r_t$ of the five principal components in the first preferred embodiment of the invention.

| Material | Thermal conductivity $(k_t)$ [W/K*m] | Thermal path distance $(l)$ [m] | Thermal resistivity $(r_t = 1/k_t)$ [K*m²/W] |
|---|---|---|---|
| Lid A5 (kovar) | $k_{t5}$ | $l_5$ | $r_{t5}$ |
| Filler A4 | $k_{t4}$ | $l_4$ | $r_{t4}$ |
| Silicon 3 | $k_{t3}$ | $l_3$ | $r_{t3}$ |
| Interconnection film A2 | $k_{t2}$ | $l_2$ | $r_{t2}$ |
| Alumina substrate A1 | $k_{t1}$ | $l_1$ | $r_{t1}$ |

The column to the left lists the components in the thermal path and in the second column the corresponding thermal conductivity k is listed. The third column lists the thickness of each layer, which is the same as the thermal path length 1. The column to the far right shows the thermal resistivity $r_t = 1/k_t$ of the individual component layers of a package.

In FIG. 25 there is shown a heat generating part, which illustrates the part of the chip A3 where the heat is generated. That is generally in an active surface of the chip. The two thermal paths leading heat out of the package originate from that part. The path which is indicated as being a thermal path direction up in FIG. 25 leads from the active surface of the chip through the non-active part of the chip A3, through the filler material 4 and through the lid A5 to ambient.

The path which is indicated as being a thermal path direction down in FIG. 25 leads from the active surface of the chip through the interconnect film A2, through a gap filled with nitrogen and through the substrate A1 to ambient.

A calculation of the thermal resistivity from chip to ambient along the path direction up from the heat generating active surface of the chip renders the following result:

$$r_{tup} = r_{t3} + r_{t4} + r_{t5} [K*m^2/W]$$

A similar calculation of the thermal resistivity along the path direction down from the heat generating active surface of the chip renders the following result:

$$r_{down} = r_{t2} + r_{t1} [K*m^2/W] \quad 5$$

The thermal resistance of a layer also depends on the area A through which the heat dissipation takes place. The thermal resistance R is therefore calculated by dividing the resistivity $r_t$ with the area A ($R = r_t/A$).

The first preferred embodiment of the package according to the invention has a chip area of $A = 15*10^{-3}$ m².

The thermal resistance from the wafer-sized chip to ambient along the upper thermal path is:

$$R_{up} = r_{up}/A \ [K/W]$$

and the thermal resistance to ambient along the thermal path downwards is:

$$R_{down} = r_{down}/A \ [K/W]$$

Since the total cooling capability depends of $R_{up}$ and $R_{down}$ the total thermal resistance from chip to ambient is:

$$R_{tot} = R_{up}*R_{down}/(R_{up}+R_{down}) [K/W]$$

We claim

1. A package for VLSI-chips, comprising:
   a) a substrate means (A1; B1; C1; E1), a frame means (3; 14; 39) and a lid means (A5; B5; C5; E5), said substrate means providing a housing having an inside cavity, first electrical contacts (4; 16; 38) being provided inside of said cavity and in electrical contact with external electrical contact means (6; 22; 41) provided on the outside of said housing,
   b) a chip means (A3; B3; C3; E3) having second electrical contacts (8; 19; 40) thereon, said chip means being provided inside said cavity,
   c) at least one first film (A2; B2; C2; E2) adjacent said chip means (A3; B3; C3; E3) having third and fourth electrical contacts (9, 5; 21, 20; 36, 37) thereon, at least two of the third contacts (9; 21; 36) being positioned to make contact with at least two of said second contacts (8; 19; 40) on said chip means, at least two of said fourth contacts (5; 20; 37) being positioned to make contact with at least two of said first contacts (4; 16; 38) being provided inside said cavity, said first film providing individual electrical connections between selected third contacts (9, 20, 36) and selected fourth contacts (5, 21, 37) to connect selected first contacts (4, 16, 38) with selected second contacts (8, 19, 40), and
   d) a pressure means to press said chip means (A3; B3; C3; E3) towards said substrate means.

2. The package according to claim 1, wherein said pressure means comprises means maintaining an underpressure in relation to atmospheric pressure in said cavity, whereby said chip means is held in place by said underpressure.

3. The package according to claim 2, wherein a sealing foil means (32;34) is provided on that side of said chip means (C3;D3) which is turned from said substrate means (C1;D1) extending over a surface area of the chip at least covering its edges and extending beyond the edges of said chip means and being attached in a gas tight manner on parts of said cavity outside said chip means, a first underpressure being provided in a first volume covered by said foil means (32;34) outside said chip means (C3;D3), said chip means (C3;D3) and said substrate means (C1;D1),
a second underpressure is provided in the cavity volume outside said first volume,
said first underpressure is stronger than said second underpressure,
said lid means (C5) is pressed towards said cavity by the atmospheric pressure.

4. The package according to claim 3, wherein said first film (B2) is an interconnection film and said sealing foil means and said interconnection film is one and the same element (B2, 34) having its third contacts provided at its part covering said chip means and its fourth contacts provided near its edges (FIG. 11).

5. The package according to claim 1, wherein said pressure means presses said lid means towards said substrate means.

6. The package in accordance with claim 5, wherein a pressure-absorbing filler means (A4;B4;C4;E4) is provided inside said cavity.

7. The package in accordance with claim 6,
wherein a pressure-absorbing filler means is selected from the group consisting of a gel, a polymer and at least one flexible, gas-filled cushion.

8. The package according to claim 1,
wherein said lid means (A5;B5;C5;E5) is flexible;
said cavity is isolated in a gas tight manner and has an inside gas pressure, which is below atmospheric gas pressure.

9. The package according to claim 1,
wherein said lid means (A5; B5; C5; E5) is stiff at least in a central part and said central part is planar on its side turned towards said cavity; and
a pressure providing means is pressing said lid means towards said substrate means such that a pressure within said cavity is provided.

10. The package according to claim 1, wherein at least one second film (1, 2; i; 24) having alpha-particle obstructing features is disposed at least between said chip means and said substrate means, said second film being polyimide or metal.

11. The package according to claim 10, wherein at least one of said alpha-particle obstructing films (i) is included in said interconnection film means.

12. The package according to claim 1, wherein said chip means (A3;L3) is situated inside said cavity having said second connection means (8) turned towards said substrate means (A1;L1); and wherein said interconnection film means (A2;L2) is disposed between said substrate means (A1;L1) and said chip means (A3;L3).

13. The package according to claim 12, wherein at least two of said third contacts (9) contacting said second contacts (8) on said chip means and said fourth contacts (5) contacting said first contacts (4) placed inside said cavity are placed opposite each other and are connected through a material of said interconnection film means (A2).

14. The package according to claim 12, wherein said first contacts inside said cavity and said fourth contacts on said interconnection film means are placed in contact with one another and are fixedly connected with each other.

15. The package according to claim 1, wherein said first contacts (50) on said substrate means (49) are situated on a side of said substrate means turned towards said cavity and in an area around said chip means (48).

16. The package according to claim 1, wherein said chip means is situated inside said cavity having said second contacts turned away from said substrate means; wherein said interconnection film means (F2) is disposed on a side of said chip means turned away from said substrate means; said first contacts (45) inside said cavity are situated in an area around said chip means; and wherein wire bonding (46) is provided between said third contacts (44) on said interconnection film means (F2) and said first contacts (45).

17. The package according to claim 1, wherein said first contacts (16) inside said cavity are placed on an internal peripheral shelf means (15); and wherein said interconnection film means (B2) has an extention covering said chip means and at least a part of said shelf means (15) and having said fourth contacts (21) in its peripheral part in register with said first contacts (16).

18. The package according to claim 1, wherein said substrate means (B1) and said frame means (14) are separate units; and wherein said first contacts (16) and said external contacts (22) are in electrical contact with each other via conductors which are provided in said frame means.

19. The package according to claim 18, wherein said frame means (14) is manufactured of a ceramic material and the substrate means is made of metal.

20. The package according to claim 1, wherein said chip means is oriented in such a manner that said second contacts turned away from said substrate means and is tied to said substrate means (F1).

21. The package according to claim 1, wherein a cooling means is provided to cool an exterior side of said substrate means (A1).

22. The package according to claim 1, wherein a cooling means is provided to cool an exterior side of said lid means (A5).

23. The package according to claim 1, wherein cooling means are provided to cool both an exterior side of said substrate means (A1) and an exterior side of said lid means (A5).

24. The package according to claim 1, wherein said chip means (B3) is situated inside said cavity having said second connection means (B19) turned away from said substrate means (B1); and wherein a layer (24) of a lenient substance having good thermal conductivity, such as soft metal, gold, or a thermally conductive paste, is placed between said chip means and said substrate means.

25. The package according to claim 1, wherein said chip means is situated inside said cavity having said second connection means turned away from said substrate means; and wherein several patches of a lenient substance having good thermal conductivity, such as soft metal, gold, or a thermally conductive paste, are distributed in an interface between said chip means and said substrate means.

26. The package according to claim 1, wherein said chip means is situated inside said cavity having said second connection means turned away from said substrate means; and wherein an internal side of said substrate means is polished to be smooth.

27. The package according to claim 1, wherein said chip means (E3) is situated inside said cavity having said second connection means turned away from said substrate means (E1); and wherein said interconnection film means (E2) is provided on said lid means (E5) in an integral way.

28. The package according to claim 27, wherein the interconnection film means is provided on an inner side of said lid means as several layers of alternating polymer and metal leader pattern layers, connection pathways being provided between said metal leader pattern layers in appropriate places.

29. The package according to claim 28, wherein said pathways are via-openings plated with metal.

30. The package according to claim 1, wherein where one of said first connection means (4) is adapted to make ohmic contact to one of said fourth connection means (5), one of said connection means, preferably said fourth connection means (5), is provided with a bump, which is a metal protrusion having considerably smaller outer surface than the connection means to which it is making contact.

31. The package according to claim 1, wherein where one of said second connection means (8) is adapted to make ohmic contact to one of said third connection means (9), one of said connection means, preferably said third connection means, is provided with a bump, which is a metal protrusion having considerably smaller outer surface than the connection means to which it is making contact.

32. The package according to claim 1, wherein interconnection film means includes several layers of alternating polymer and metal leader pattern layers (e,f,g,-h,i,j,k), connection pathways (11) being provided between said metal leader pattern layers (e,g,k) in appropriate places.

33. The package according to claim 32, wherein the surfaces of said third and fourth connecting means are in form of metal surfaces on a polymer film, said metal surfaces being provided by at least two layers of different metals having different conductivity.

34. The package according to claim 33, wherein an outermost metal layer is provided at least spotwise (9, 5).

35. The package according to claim 1, wherein a multilayer leader pattern (18) comprising polymer as isolator between leaders is disposed on said chip means (42) on its side turned towards said interconnection film means, said multilayer leader pattern (18) having metallized pathways (43) for connections between said metal leader patterns and for connections to pads (19) on said chip means and to said inner first connection means in said cavity.

36. The package according to claim 1, wherein said contact means (6;22;41) on an exterior side of said package are provided at least on one broadside of the package along at least one lateral side of the package near the edge of it, preferably along all lateral sides of the package.

37. The package according to claim 36, wherein said contact means (6) on an exterior side of said package are provided on a laterally protruding shelf means (3;14;39).

38. The package according to claim 36, wherein said contact means on an exterior side of said package include elongated contact means (gnd, Vcc) for connection to ground and supply voltage extending along the edge of the package.

39. The package according to claim 36, wherein said contact means on an exterior side of the package are provided in at least two parallel lines (28,29,30) extending to said edge of the package.

40. The package according to claim 1, wherein leaders (7) making contact between said first connection means (4) inside said cavity and said contact means (6) on an exterior side of the package are of the following three types: ground leaders, voltage supply leaders and groups of three balanced data leaders (Kr,Ks,Kt), a sum of currents and a sum of voltages, respectively, on said data leaders (Kr,Ks,Kt) being constant in time.

41. The package according to claim 40, wherein said data leaders (Kr,Ks,Kt) are provided as three planar, symmetrical leaders provided side by side and having such mutual dimensions that a same characteristic impedance is provided between arbitrary combinations of them.

42. The package according to claim 41, wherein the two outermost data leaders (Kr,Kt) are broader than the data leader (Ks) placed between them, and wherein the width ratio between said data leaders is fixed.

43. The package according to claim 40, wherein a non-connected leader (S1) is provided in a plane parallel to a plane in which said data leaders (Kr,Ks,Kt) are provided and electrically isolated in relation to said data leaders and covering an area extending a predetermined distances over said outermost data leaders (Kr,Kt).

44. The package according claim 40, wherein the width of said data leaders (Kr,Ks,Kt) are varying along their path while keeping the characteristic impedance between them constant.

45. The package according to claim 1, wherein an electrical connection between said first connection means inside said cavity and said contact means (N8) on an exterior side of said housing are drawn in a plane parallel to a broad side of said housing in said substrate means and drawn to said outside contact means (N8) on the outside of said housing away from said plane in at least one plane perpendicular to said plane parallel to said broad side.

46. The package according to claim 1, wherein said chip is wafer-sized.

47. The package according to claim 1, said chip means (A3; B3; C3; E3) being floatingly mounted inside said cavity without any bonding, and held in place by means of said pressure away from said pressure means.

48. The package according to claim 1, wherein said chip means is floatingly mounted inside said cavity by means of a small spot of adhesive applied to a central portion of the chip, thereby to avoid problems with thermal stress.

* * * * *